United States Patent [19]
Koizumi et al.

[11] Patent Number: 5,275,921
[45] Date of Patent: Jan. 4, 1994

[54] PATTERN FORMING PROCESS

[75] Inventors: Taichi Koizumi, Osaka; Yoshiyuki Tani, Neyagawa; Masaru Sasago, Hirakata, all of Japan

[73] Assignee: Matsushita Electric Industrial Co., Ltd., Osaka, Japan

[21] Appl. No.: 672,937

[22] Filed: Mar. 21, 1991

[30] Foreign Application Priority Data

Mar. 27, 1990 [JP] Japan .................. 2-077864

[51] Int. Cl.$^5$ .............................. G03F 7/30
[52] U.S. Cl. .................... 430/326; 430/325; 430/330; 430/192; 430/190; 430/270
[58] Field of Search ............... 430/325, 326, 330, 271, 430/190, 192

[56] References Cited

U.S. PATENT DOCUMENTS

| 3,925,077 | 12/1975 | Lewis et al. | 430/326 |
| 4,491,628 | 1/1985 | Ito et al. | 430/326 |
| 4,818,658 | 4/1989 | Martin et al. | 430/326 |
| 4,996,136 | 2/1991 | Houlihan et al. | 430/326 |
| 5,064,741 | 11/1991 | Koike et al. | 430/270 |

FOREIGN PATENT DOCUMENTS

| 0102450 | 3/1984 | European Pat. Off. |
| 0287750 | 10/1988 | European Pat. Off. |
| 2509019 | 9/1975 | Fed. Rep. of Germany |

OTHER PUBLICATIONS

A. R. Neureuther, "Photoresist Containing Absorbing Dye," IBM Technical Disclosure Bulletin, vol. 16, No. 1, pp. 334–336, Jun. 1973.

Primary Examiner—Christopher Rodee
Attorney, Agent, or Firm—Stevens, Davis, Miller & Mosher

[57] ABSTRACT

In a pattern forming process using a chemical amplification type resist, a good pattern with high contrast between exposed portions and non-exposed portions due to photobleach of a dye and a large process latitude can be obtained by adding a dye such as Sudan Orange, or a dye having a reducing absorption by exposure to light such as naphthoquinonediazide sulfonic acid ester to a chemical amplification type resist for ultraviolet rays, particularly i-line of 365 nm or ultraviolet rays of 365 nm or less.

6 Claims, 6 Drawing Sheets

PATTERN FORMING PROCESS

BACKGROUND OF THE INVENTION

The present invention relates to a pattern forming process used in production of semiconductor elements, etc. More particularly, the present invention relates to a pattern forming process used for pattern formation employing ultraviolet rays of 450 nm or less, particularly i-line of 365 nm as an energy source for exposure.

Figure 8A:
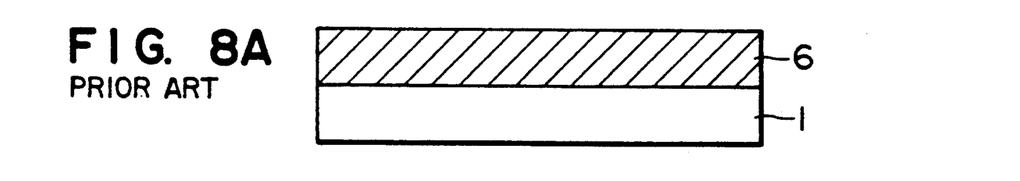
FIGS. 8A to 8D are cross-sectional views showing steps of a conventional pattern forming process.
Figure 8B:
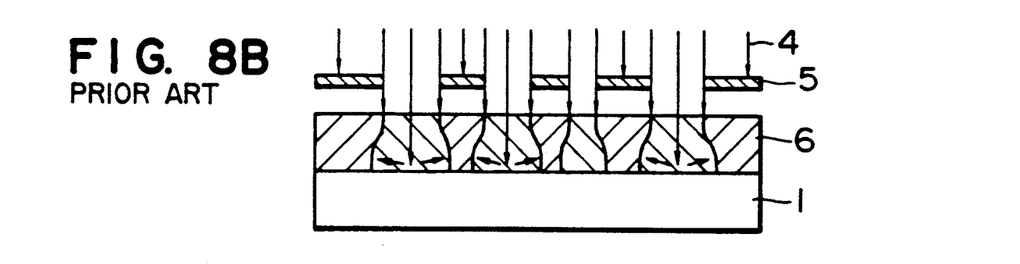
Figure 8C:
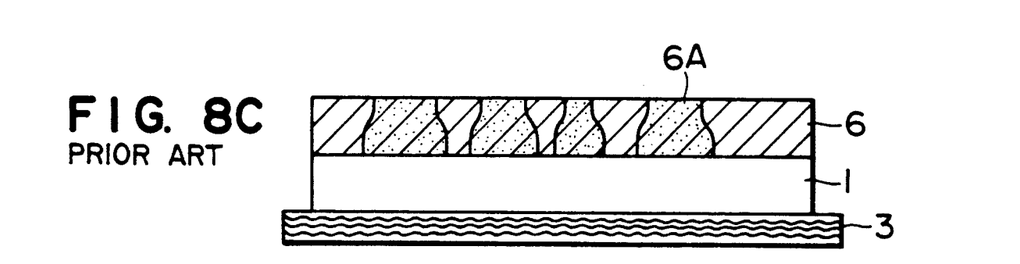
Figure 8D:
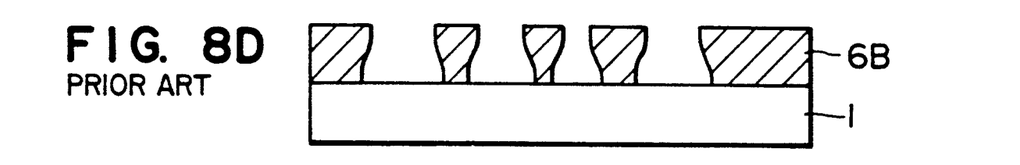

It has been reported to apply conventional chemical amplification type resists to deep ultraviolet rays (e.g. of excimer laser), X-rays and electron-beam lithography, and good results have been obtained. Their application to i-line which has a short wavelength and is promising for formation of fine pattern, was also considered; however, it has been seldom tried because conventional chemical amplification type resists have little absorption for i-line and have been presumed to have no sensitivity to i-line. Under such circumstances, the present inventors exposed chemical amplification type resists to i-line and confirmed that chemical amplification type resists are effective also in an i-line region. In FIG. 8 is shown an example of the pattern forming process using a conventional chemical amplification type resist. A conventional chemical amplification type resist 6 is spin coated on a semiconductor silicon substrate 1, and then is soft baked on a hot plate 3 at 90° C. for 90 sec to obtain a pattern forming film of 1.28 μm in thickness [FIG. 8A]. Next, an i-line 4 is applied through a mask 5 [FIG. 8B]. Baking is effected on the hot plate 3 at 110° C. for 90 sec [FIG. 8C]. Thereafter, development with tetramethylammonium hydroxide (TMAH) is effected for 60 seconds to dissolve the exposed portions 6A of the conventional pattern forming material 6 to obtain a positive type pattern 6B [FIG. 8D]. However, conventional chemical amplification type resists show little absorption to i-line as mentioned above; accordingly, they are easily affected by the reflection from the substrate as shown in FIG. 8B to form a pattern of reversed taper shape as shown in FIG. 8D; as a result, they have been unable to provide a fully satisfactory pattern.

As mentioned above, the present inventors confirmed that conventional chemical amplification type resists are effective also in an i-line region. However, showing little absorption to i-line, these resists are easily affected by the reflection from the substrate and form a pattern of reversed taper shape.

SUMMARY OF THE INVENTION

In view of the above situation, the present invention is intended to provide a pattern forming process for forming a pattern of good shape at a high sensitivity in a wide process latitude (mask linearity, wide focus latitude) by employing, as an energy source for exposure, i-line of 365 nm or ultraviolet rays having a wavelength of 365 nm or less and, as a resist, a chemical amplification type resist.

The present invention provides a process for forming a pattern comprising:

a step of forming, on a substrate, a chemical amplification type resist thin film having absorption in an i-line region, a step of exposing the resist film selectively to an i-line or ultraviolet rays having a wavelength of 365 nm or less, a step of heat-treating the substrate, and a step of developing the resulting resist film with a developing solution to form a resist film pattern on the substrate.

In order to allow the chemical amplification type resist to have absorption in an i-line region, there can be employed various means, for example, use of a dye having absorption in an i-line region, use of a dye having absorption in an i-line region and showing decreased absorption when exposed to i-line, and use of a resin (as a resist component) having absorption in an i-line region.

DESCRIPTION OF THE PREFERRED EMBODIMENTS

Figure 6:
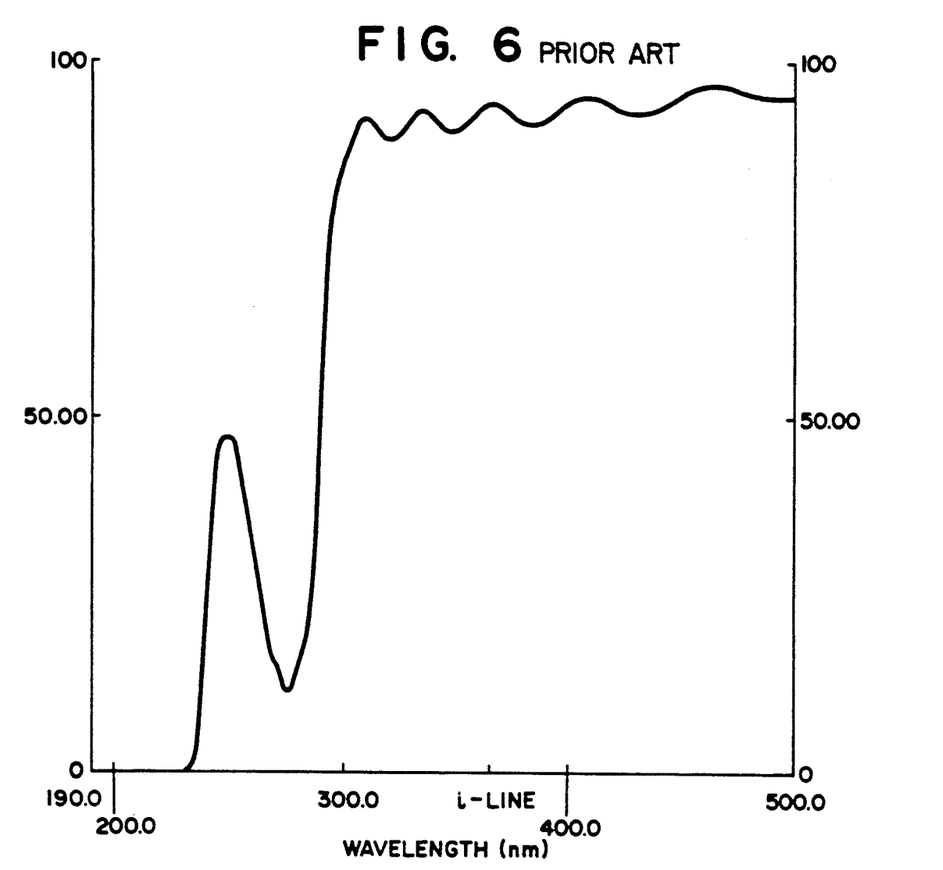
FIG. 6 is an ultraviolet spectral curve of a chemical amplification type resist consisting of a conventional material.
Figure 7:
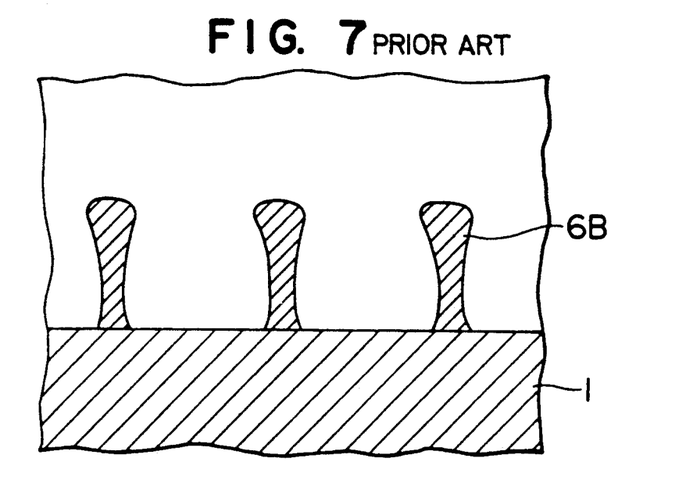
FIG. 7 is a view showing a pattern shape formed with a conventional chemical amplification type resist containing no dye.

FIG. 6 shows an ultraviolet spectral curve of a chemical amplification type resist consisting of a conventional material. As is apparent from FIG. 6, the conventional chemical amplification type resist shows little absorption to i-line. However, the conventional chemical amplification type resist becomes sensitive to i-line and can form a pattern when it contains an acid generator having even very low absorption in an i-line region. Therefore when the conventional chemical amplification type resist is subjected to light exposure as it is, there is formed a resist pattern 6B of T shape or reverse taper shape as shown in FIG. 7.

The present inventors confirmed that a pattern of good shape can be obtained by adding, to a conventional chemical amplification type resist, a dye (e.g. Sudan Orange) or a dye showing decreased absorption when subjected to light exposure (e.g. naphthoquinonediazide sulfonic acid ester) to allow the resist to have absorption in an i-line region and further by adjusting the transmittance of the resulting resist to 40-80%. The addition of a dye greatly reduces the reflection from the substrate, whereby a pattern of good shape can be obtained. A pattern of further improved shape can be obtained by adjusting the transmittance of a chemical amplification type resist containing a dye showing decreased absorption by light exposure, to 40-80% before light exposure and 90-98% after light exposure. This is not only because the transmittance adjustment greatly reduces the reflection from the substrate but also because the dye shows decreased absorption by light exposure, i.e. photobleach and resultantly the contrast between the exposed portions and the unexposed portions becomes high.

Thus, the addition to a conventional chemical amplification type resist, of a dye or a dye showing decreased absorption by light exposure greatly reduces the reflection from the substrate, gives high contrast between the exposed portions and the unexposed portions owing to the photobleach of the dye, and enables formation of a good pattern.

The present invention is described by way of the following Examples.

EXAMPLE 1

A reagent having the following composition was prepared and used as a pattern forming material.

Base polymer having the following formula (I) 30 g

| 2,6-Dinitrobenzyl p-toluenesulfonate | 1.5 g |
| | (1.0–5.0 g) |
| Naphthoquinonediazide sulfonic acid ester (dye) | 0.2 g |
| | (0.1–0.4 g) |
| Diethylene glycol dimethyl ether | 70 g |

Figure 2:
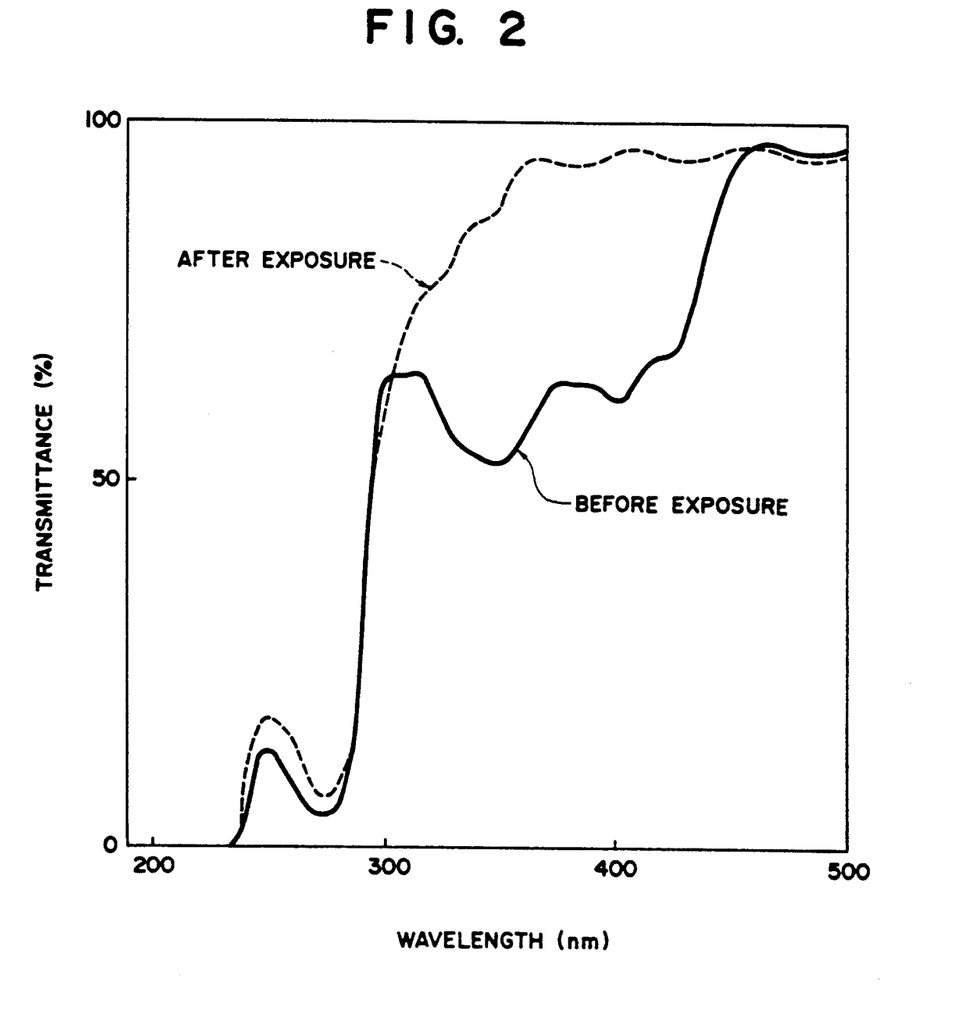
FIG. 2 is an ultraviolet spectral curve of the pattern forming material of one example of the present invention, wherein the solid line indicates before light exposure and the broken line indicates after light exposure.
Figure 3:
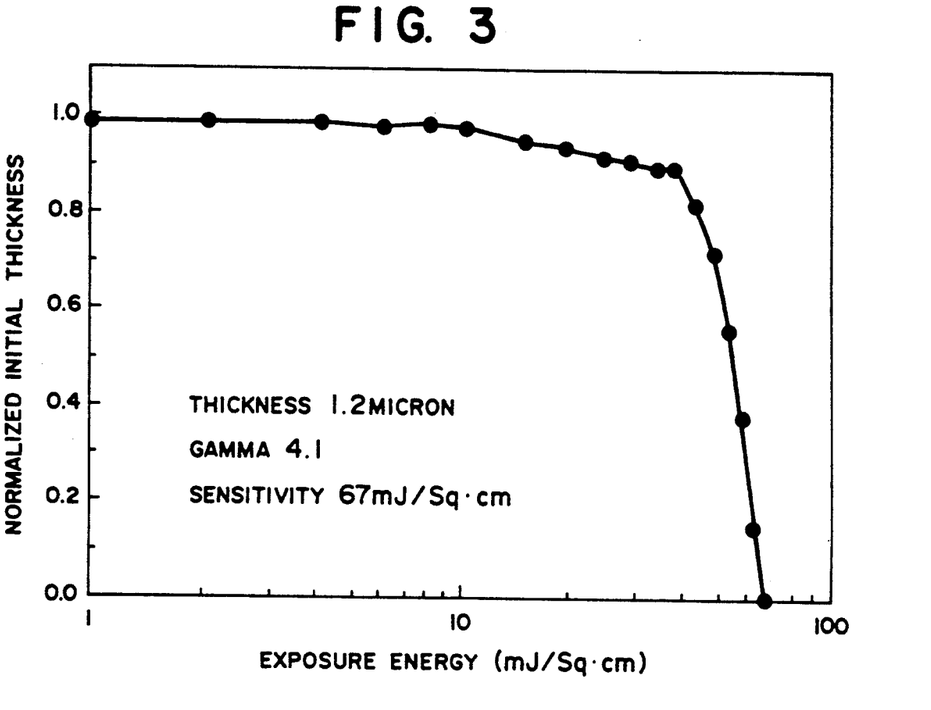
FIG. 3 is an irradiation characteristic curve of the pattern forming material of one example of the present invention.

A pattern forming process using the above material is explained with reference to FIG. 1. The pattern forming material 2 prepared so as to have the above composition was spin coated on a semiconductor silicon substrate 1 and soft baked on a hot plate 3 at 90° C. for 90 seconds to obtain a pattern forming film of 1.28 μm in thickness [FIG. 1A]. Incidentally, the substrate 1 has thereon, in many cases, an insulator, semiconductor or conductor film. The ultraviolet spectral curve of the pattern forming film is shown in FIG. 2. This resist had transmittances of 60% before light exposure and 95% after light exposure. The irradiation characteristic of the film is shown in FIG. 3. Thus, the film gave high sensitivity and a high γ-value. Next, an i-line 4 of 365 nm was applied through a mask 4 [FIG. 1B]. At this time, the exposed portions 2A show a larger transmittance with the progress of light exposure owing to the photobleach of the naphthoquinonediazide sulfonic acid ester and, when the transmittance has reached a certain level, the 2,6-dinitrobenzyl p-toluenesulfonate (an acid generator) begins to generate an acid. The acid is hardly generated in the boundaries between the exposed portions and the unexposed portions because the irradiating light is very weak in the boundaries and absorbed by the naphthoquinonediazide sulfonic acid ester. The reflected light from the substrate is also absorbed by the naphthoquinonediazide sulfonic acid ester, and there is little possibility that the unexposed portions will be affected by the reflected light from the substrate. As a result, the degree of acid generation differs largely between the exposed portions and the unexposed portions. Since a wire pattern made of Al or the like, having a high reflectivity, is usually formed on a semiconductor substrate, the substrate generally shows high reflection. The present invention is particularly useful in such a case.

Figure 1A:
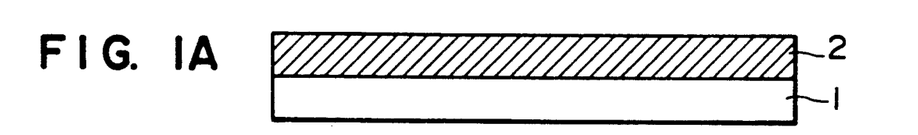
FIGS. 1A to 1D are cross-sectional views showing steps of the pattern forming process of one example of the present invention.
Figure 1B:
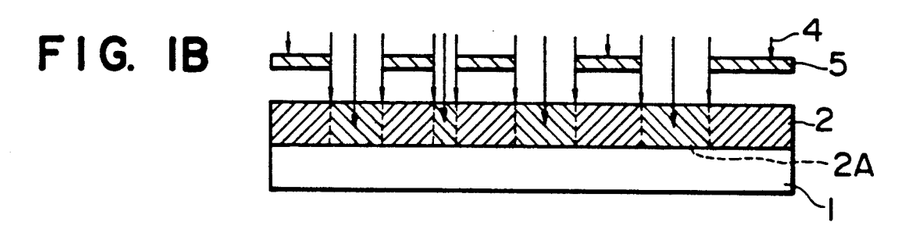
Figure 1C:
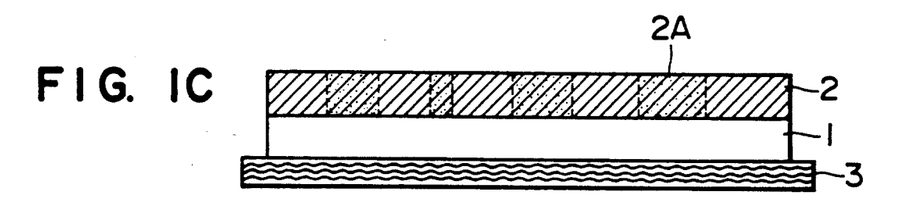
Figure 1D:
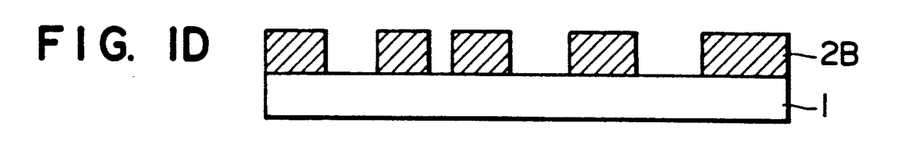

The irradiated resist is then baked on a hot plate 3 at 110° C. for 90 seconds [FIG. 1C], whereby the generated acid attacks a base polymer in the resist material 2 to give rise to a reaction shown by the following reaction formula. As a result, the base polymer is converted to a polyvinylphenol which is soluble in a polar developing solution such as aqueous alkali solution.

An acid is also generated in this reaction, and this acid attacks another polymer molecule to give rise to the same reaction. Therefore, sensitization occurs mainly in the heat treatment after light exposure; the amount of acid generated can be very small; accordingly, the sensitivity is very high. After the heat treatment, the pattern forming material 2 was developed with a mixture of tetramethylammonium hydroxide (TMAH) and 10% isopropyl alcohol for 30 seconds to dissolve and remove the exposed portions 2A of the material 2 to obtain a positive type pattern 2B [FIG. 1D]. A pattern of high contrast could be obtained because the amount of acid generated differed largely between the exposed portions and the unexposed portions.

Figure 4:
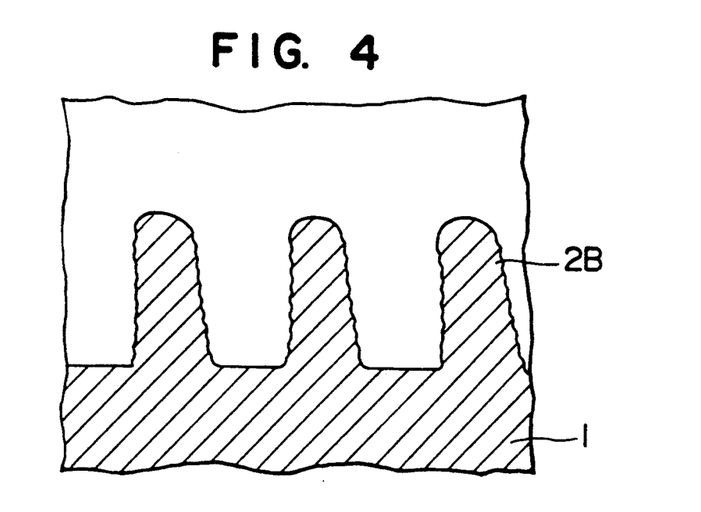
FIG. 4 is a view showing a pattern shape formed with the pattern forming material of one example of the present invention.

FIG. 4 shows a line and space pattern of 0.6 μm.

As is clear from FIG. 4, the above test for pattern formation gave a pattern of good properties and high contrast.

Comparison of the above-prepared resist of the present invention with a conventional chemical amplification type resist containing no dye is shown below in Table 1.

TABLE 1

| | Conventional resist | Resist of the present invention |
|---|---|---|
| Sensitivity | 55 mJ/cm² | 67 mJ/cm² |
| γ-Value | 3.0 | 4.1 |
| Mask linearity | 0.60 μm | 0.40 μm |
| Focus latitude | 2.4 μm | 3.3 μm |
| Resolution limit | 0.45 μm | 0.35 μm |
| Heat resistance | 120° C. | 160° C. |

Figure 5:
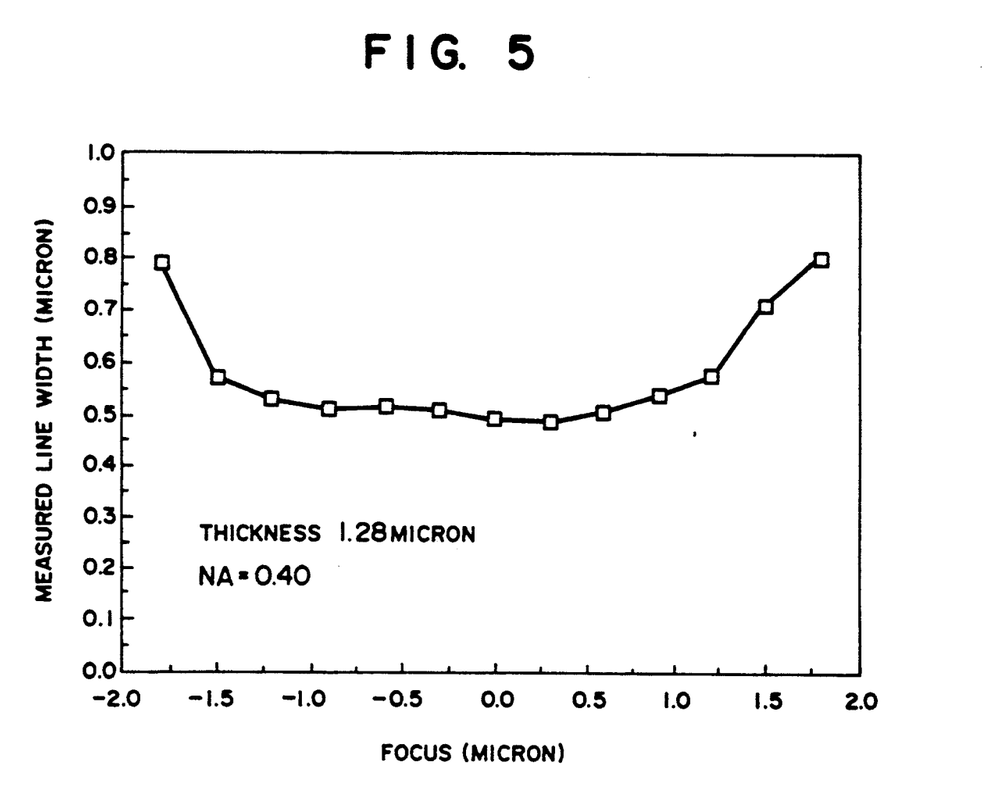
FIG. 5 is a graph showing a focus latitude of the pattern forming material of one example of the present invention.

As seen in Table 1, the resist of the present invention gives a large γ-value (high contrast) because it contains a dye. For the same reason, the resist is hardly affected by the reflection from the substrate. As a result, the resist of the present invention, unlike the conventional resist containing no dye, causes no pattern thinning in which the contrast between the exposed portions and the unexposed portions is low and any pattern of 0.6 μm or less gets thinner, and enables formation of a pattern of 0.4 μm or more which is faithful to the mask dimension. FIG. 5 shows a focus latitude in 0.5 μm line, of the resist of the present invention. Thus, the present resist has a wide focus latitude of 3.3 μm in range. Owing to the high contrast, the present resist has a very high resolution of 0.35 μm, as compared with 0.45 μm of the conventional resist containing no dye. Further, the present resist has improved heat resistance because it contains a polyvinylphenol as a base polymer.

As seen above, the resist of the present invention is far superior to the conventional resist containing no dye.

EXAMPLE 2

The process of Example 1 was repeated except for using, as the resin, a resin represented by the following formula:

(II)

30 g m:n = 2:3

The same good results as in Example 1 were obtained.

EXAMPLE 3

The process of Example 1 was repeated except for using, as the acid generator, a compound represented by the following formula:

(III)

(1.0–10 g)

The same good results as in Example 1 were obtained.

EXAMPLE 4

The process of Example 1 was repeated except for using Sudan Orange as the dye.

The same good results as in Example 1 were obtained, although the sensitivity was slightly lower.

In the above Examples, there was used, as the base polymer, a polymer obtained by protecting the hydroxyl group of a polyvinylphenol with a tert-butoxy group. The base polymer can be any resin having a group which is alkali soluble in an acid ambience, for example, polymers protected with a methyl group, an isopropyl group, a t-butyl group, a methoxymethyl group, an isopropoxymethyl group, a tetrahydropyranyl group, a tetrahydrofuranyl group, a trimethylsilyl group, a tert-butoxycarbonyl group, an isopropoxycarbonyl group, or the like.

As the acid generator, there was used 2,6-dinitrobenzyl p-toluenesulfonate or an onium salt. The acid generator can be any compound capable of generating an acid when exposed to ultraviolet rays, such as sulfonic acid compounds, carboxylic acid compounds and the like. Preferable examples are as follows:

As the dye, there was used Sudan Orange and, it is possible to use a dye showing decreased absorption when exposed to ultraviolet rays such as a naphthoquinonediazide sulfonic acid ester compound, Michler's ketone, 2,4-diethylthioxanthone, etc. Such a dye can be any dye having absorption in an ultraviolet region and, when exposed to ultraviolet rays, showing decreased absorption.

Further, by using, as the base polymer, a polymer having repeating units of the following formula (IV) or (V) having absorption in an ultraviolet region or a polymer having repeating units of the following formula (VI) having absorption in an ultraviolet region and, when exposed to ultraviolet rays, showing decreased absorption, there can be obtained equivalent results.

polymers having absorption in an ultraviolet region;

Polymer having absorption in an ultraviolet region and when exposed to ultraviolet rays, showing decreased absorption.

As described above, the present invention provides a pattern forming process using a novel pattern forming material which has high sensitivity to ultraviolet rays, particularly i-line, which gives a pattern of high contrast, and which is stable to a lithography process. The pattern forming process of the present invention is applicable to devices of 0.45–0.50 μm rule, gives semiconductor elements of improved fineness and yield, and has a high industrial value.

What is claimed is:

1. A process for forming a pattern which comprises:
  forming on a substrate a resist thin film having absorption at about 365 nm and obtained from a composition comprising:
  (a) a base polymer obtained from a polyvinylphenol and having a tert-butoxy group which protects the hydroxy group of the polyvinylphenol;
  (b) an acid generator; and
  (c) a dye having an ability to photo-bleach at about 365 nm;
  exposing the resist film selectively to an i-line having a wavelength of about 365 nm;
  heat-treating the substrate; and
  developing the resulting resist film with an aqueous alkali solution to form a resist film pattern on the substrate.

2. A process according to claim 1, wherein the dye is a naphthoquinonediazide sulfonic acid ester.

3. A process according to claim 1, wherein the resist thin film has a transmittance of 40–80% before light exposure and 90–98% after light exposure.

4. A process according to claim 1, wherein the acid generator is selected from the group consisting of 2,6-dinitrobenzyl p-toluenesulfonate, and an onium salt.

5. A process according to claim 1, wherein the acid generator is selected from the group consisting of 6. A process for forming a pattern which comprises:
  forming on a substrate a resist thin film having absorption at about 365 nm and obtained from a composition comprising:
  (a) a base polymer having repeating units which have absorption in an ultraviolet region selected from the group consisting of (b) an acid generator;
exposing the resist film selectively to an i-line having a wavelength of about 365 nm;
heat-treating the substrate; and
developing the resulting resist film with an aqueous alkali solution to form a resist film pattern on the substrate.

* * * * *